United States Patent [19]
Jobson

[11] Patent Number: 4,964,809
[45] Date of Patent: Oct. 23, 1990

[54] ELECTRICAL TEST EQUIPMENT

[75] Inventor: Ian Jobson, Croxley Green, England

[73] Assignee: AMP Incorporated, Harrisburg, Pa.

[21] Appl. No.: 412,695

[22] Filed: Sep. 26, 1989

[30] Foreign Application Priority Data

Oct. 24, 1988 [GB] United Kingdom ............... 8824831

[51] Int. Cl.⁵ .......................................... H01R 13/627
[52] U.S. Cl. ................................ 439/357; 324/158 P;
439/912
[58] Field of Search ............... 439/289, 293, 294, 295,
439/357, 482, 695, 701, 824, 912, 169, 219, 146,
700, 903; 324/158 P, 158 F, 149, 72.5

[56] References Cited
U.S. PATENT DOCUMENTS

| 2,858,518 | 5/1957 | Chrystie et al. | 439/824 |
| 4,431,242 | 2/1984 | Gisewsky | 439/289 |
| 4,770,644 | 9/1988 | Feder | 439/166 |

FOREIGN PATENT DOCUMENTS 0813559  3/1981  U.S.S.R. ............................ 439/824

OTHER PUBLICATIONS

Standard European Search Report, 9-25-89.
GB Patent Specification 533,681.

Primary Examiner—Eugene F. Desmond

[57] ABSTRACT

For applying test probes (40) to socket contact elements (92) of a standard electrical connector (52), a test probe assembly comprises an adaptor (2) carrying the test probes (40), and latched into a standard electrical connector insulating housing (48) for mating with the electrical connector (52) so that each test probe (40) engages one of the contact elements (92) of the connector (52). The adaptor (2) can also be latched to the housing (72) of the connector (52), with the contact elements (92) absent therefrom, to provide a second form of the test probe assembly for mating with the standard insulating housing (48) to probe male contact elements when provided in that housing (48). Thus apart from the housing (4) of the adaptor (2) no additional mouldings are needed to provide for the probing of two different kinds of mating connectors.

9 Claims, 4 Drawing Sheets

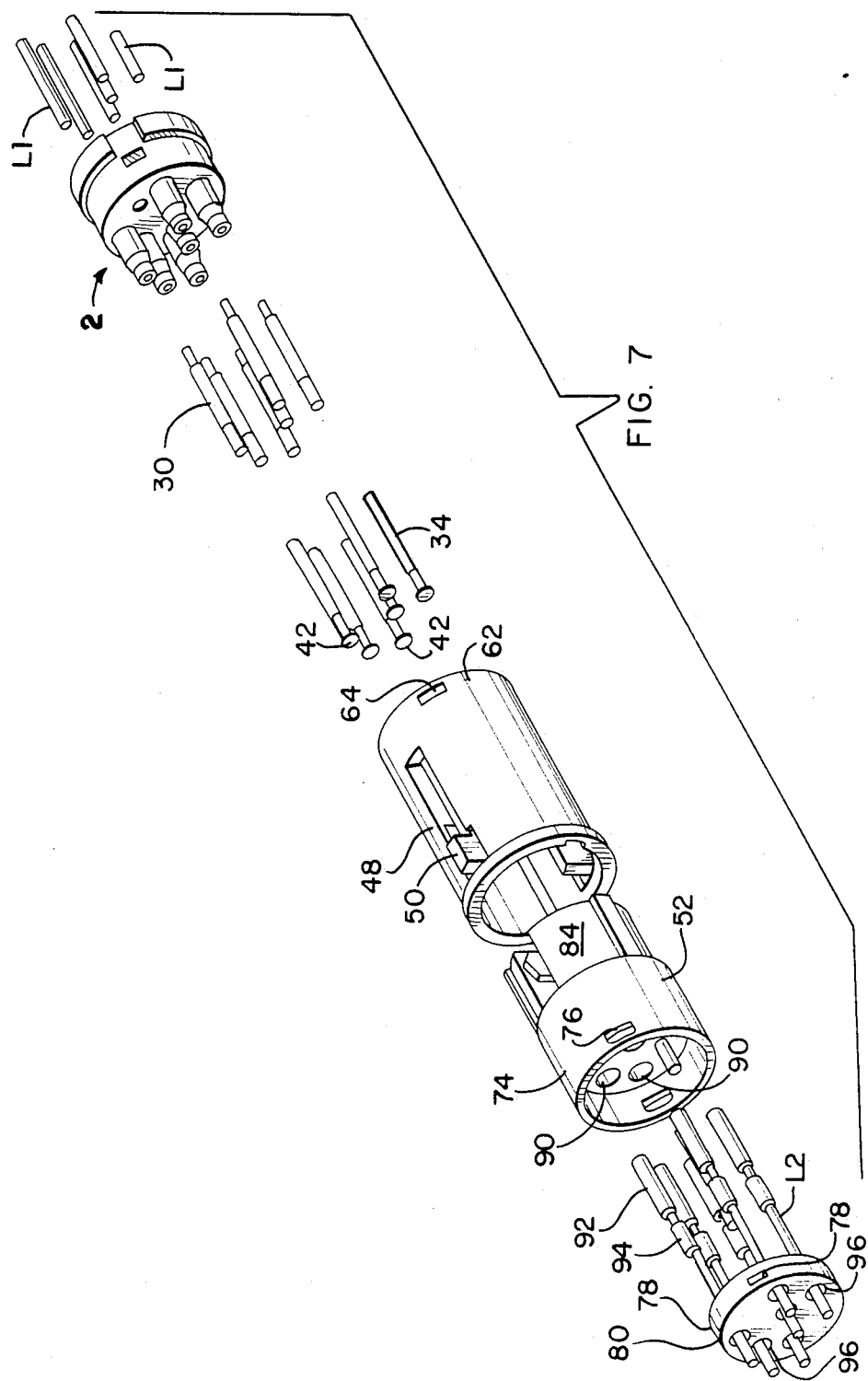

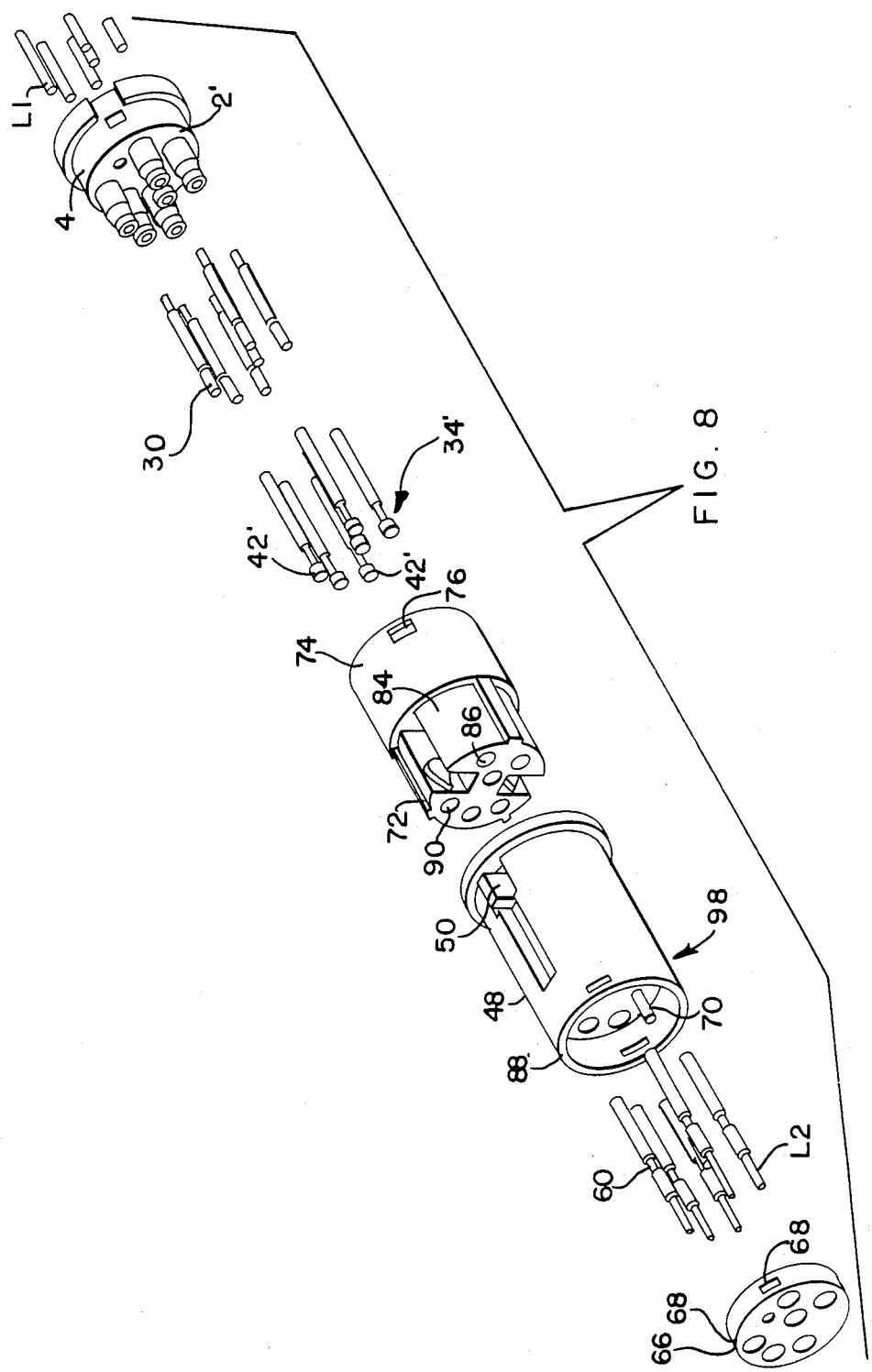

ELECTRICAL TEST EQUIPMENT

FIELD OF THE INVENTION

This invention relates to an electrical test probe assembly, and to an electrical test probe adaptor.

BACKGROUND OF THE INVENTION

The invention especially concerns the diagnostic testing of automotive electrical systems and the on-line production testing of electrical connectors for use in the automotive industry. Diagnostic testing is commonly carried out at a garage at which an automotive vehicle is serviced or, for example at a pit stop in automobile racing.

The problem which the invention is intended to solve is that of providing a test probe assembly employing a standard electrical connector housing and test kits comprising such assemblies, in order to minimize the number of different mouldings that need be produced for the assemblies, the connector housings for the test probe assemblies and kits being the same as those of the connectors to be tested, or through the medium of which electrical systems are to be tested.

SUMMARY OF THE INVENTION

According to one aspect of the invention, an electrical test probe assembly comprises; an electrical test probe adaptor insulating housing formed with a plurality of through, first cavities each opening at one end outwardly of a mating face of the adaptor housing; an electrically conductive test probe barrel secured in each through cavity and having therein a slidably mounted, but captive, electrical test probe projecting outwardly of said mating face and being urged axially away therefrom by a spring, said barrel having means for electrically connecting it to an electrical lead to extend outwardly from the other end of the through cavity in which the barrel is secured; an electrical connector insulating housing formed with a plurality of through second cavities each opening into first and second opposite mating faces of the connector housing which is matable with a mating electrical connector so that contact elements of the latter project towards, on into, respective ones of said second cavities; and means for fixedly latching said adaptor and connector housings together with the mating face of the adaptor housing in aligned, face-to-face relationship with the first mating face of the connector housing, so that each test probe extends through, or into, a respective one of said second cavities for resilient engagement with a respective contact element of said mating connector when it has been mated with the connector housing.

Thus, the electrical connector insulating housing of the assembly may be that of a standard electrical connector, the adaptor being mated therewith to load it with test probes, instead of the electrical contact elements that its cavities would normally contain. In a test kit comprising a pair of test probe assemblies, the electrical connector insulating housing of one of the assemblies will be adapted to mate with a female connector to be tested, the electrical connector insulating housing of the other test probe assembly being adapted to mate with a male electrical connector to be tested. Thus, for the production of the test probe assemblies and of the said mating electrical connectors, that is to say the connectors to be tested, only two different connector housing mouldings are required apart from the test probe adaptor housing moulding.

Electrical connectors for use in the automotive industry, are in some cases provided with an anti-backout cap, which is latched into a skirt projecting from the housing of the connector and serves to prevent the contact elements of the connector from being withdrawn therefrom, especially when tension is exerted upon leads to which the contact elements are connected, or under the action of vibration to which the connector is subjected when the vehicle is in use. Conveniently, the adaptor housing can be adapted to be latched into the skirt of the connector housing of the test probe assembly in place of the anti-backout cap.

In order to compensate for differences in diameter between the test probe barrels and said second cavities, which are, as mentioned above, intended to receive electrical contact elements which are normally of substantially larger cross-section than the test probe barrels each probe barrel may be surrounded by an open ended insulating sleeve projecting from the mating face of the adaptor housing and being dimensioned for snug reception in the respective second cavity.

Conveniently, the adaptor housing may be provided with keying means which are complimentary with keying means of the standard electrical connector housing of the test probe assembly.

According to another aspect of the invention, an electrical test probe adaptor, comprises an insulating adaptor housing formed with a plurality of parallel, through cavities opening outwardly of a mating forward face of the adaptor housing and into an opposite rear face thereof; an electrically conductive test probe barrel secured in each through cavity and having therein a slidably mounted, but captive electrical test probe projecting from one end of said barrel and outwardly of said mating face and being urged axially away therefrom by a spring, the other end of said barrel being crimped to an electrical lead extending from the rear face of the adaptor housing; a plurality of parallel, open ended insulating sleeves extending from said mating face and each surrounding a respective one of said test probe barrels; and latching means projecting from the adaptor housing for latching it fixedly to a mating connector housing.

The latching means, which must be capable of withstanding the combined forces of the test probe springs may be in the form of latching members distributed about the periphery of the adaptor housing between the forward and the rear faces thereof, for latching engagement in complimentary openings in the skirt of the electrical connector housing of the adaptor assembly.

The electrical testing kit employs standard connectors, as mentioned above, the adaptor housing being capable of carrying a range of spring loaded test probes, and of centralizing the probes in alignment with the pin or socket centers of the standard mating connector housing. The required height of the test probes can be set by preloading the probe barrels into the adaptor housing at appropriate depths in the cavities thereof.

BRIEF DESCRIPTION OF THE DRAWING

For a better understanding of the invention and to show how it may be carried into effect, a reference will now be made by way of example to the accompanying drawings in which;

FIG. 7 is an exploded isometric view of the assembly of FIGS. 5 and 6 drawn to a reduced scale; and FIG. 8 is a similar view to that of FIG. 7 but showing a modified form of the assembly when mated with an electrical pin connector.

DETAILED DESCRIPTION OF THE INVENTION

Figure 1:
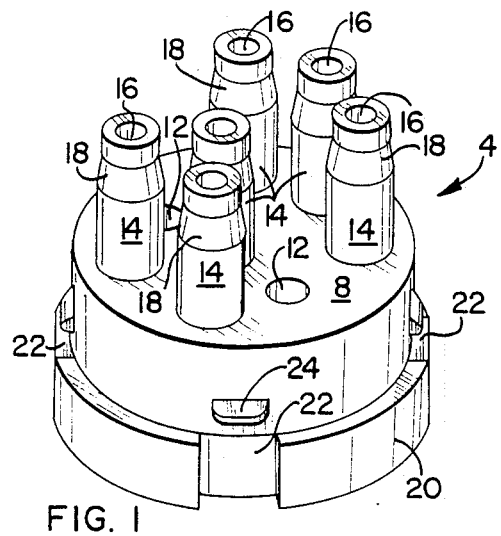
FIG. 1 is an isometric view of an insulating housing of an electrical test probe adaptor.
Figure 2:
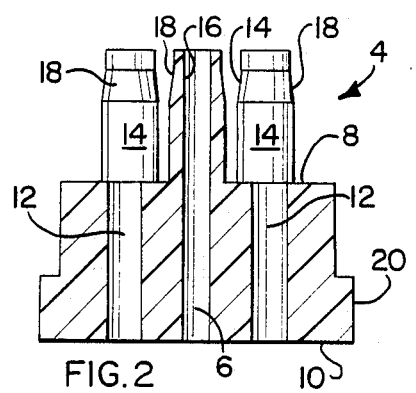
FIG. 2 is a sectional view through the housing.
Figure 3:
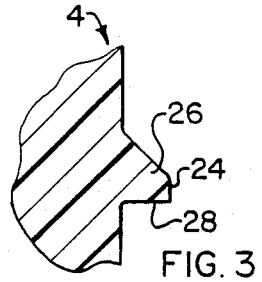
FIG. 3 is an enlarged fragmentary sectional view illustrating a detail of FIG. 1.
Figure 4:
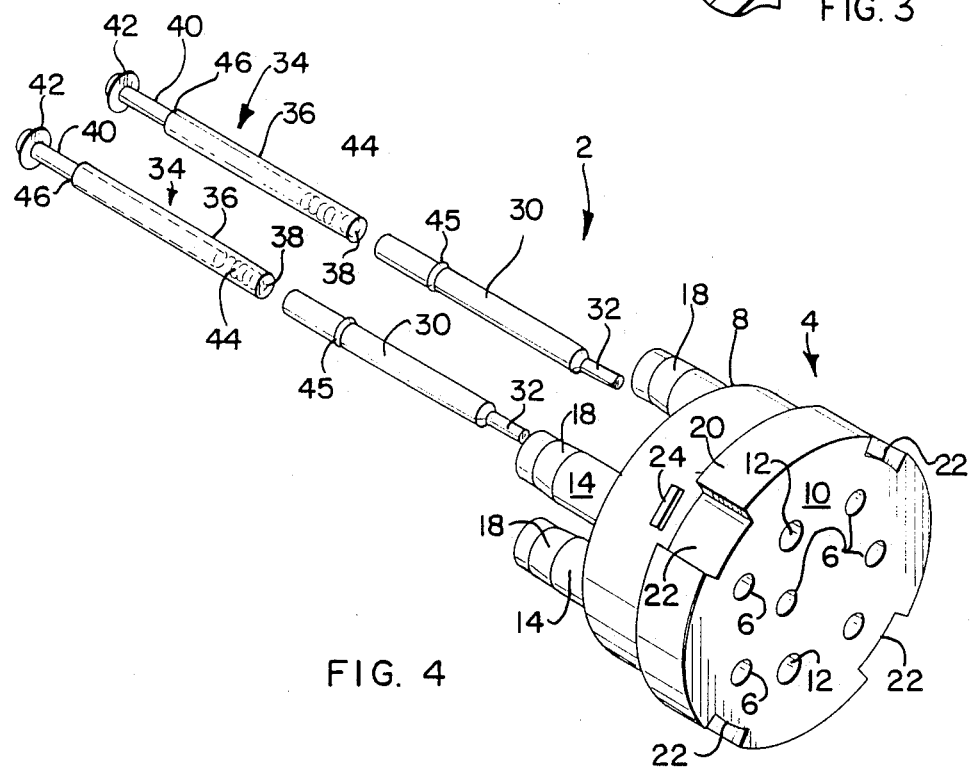
FIG. 4 is an exploded, isometric view of an electrical test probe adaptor comprising the housing shown in FIGS. 1 and 2.
Figure 6:
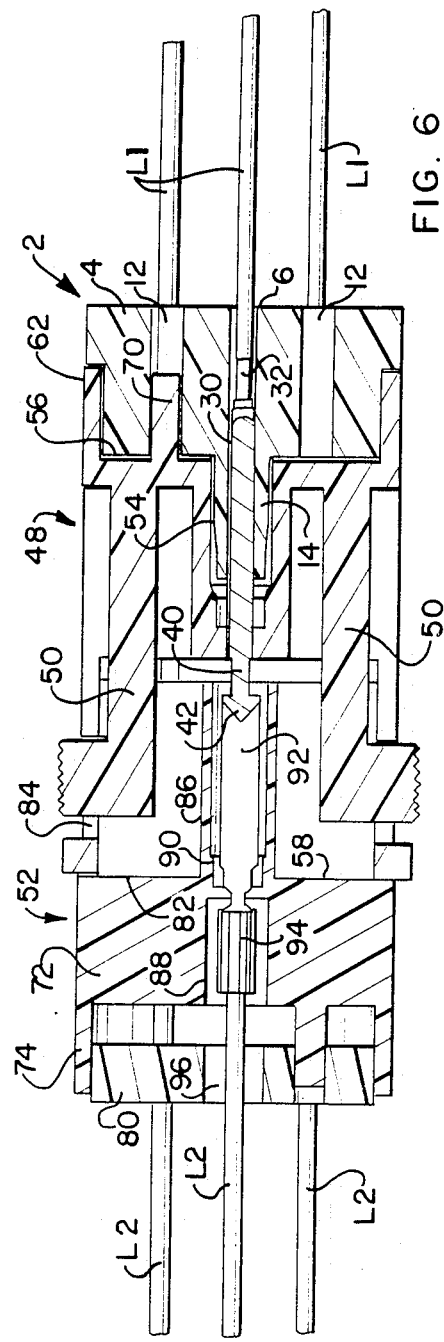
FIG. 6 is a diagrammatic longitudinal sectional view of the assembly of FIG. 5 including the socket connector.

The electrical test probe adaptor, which is generally referenced 2, will now be described with reference to FIGS. 1 to 4. The adaptor 2 comprises a substantially circular insulating housing 4 formed with a plurality of through cavities 6 each opening outwardly of a forward, mating face 8 of the housing 4 and into an opposite rear face 10 thereof, as best seen in FIG. 2. A pair of circular cross section, through key-ways 12 also extend between the faces 8 and 10. Formed integrally with the remainder of the housing 4, are open ended, parallel insulating sleeves 14 which project forwardly from the mating face 8, each sleeve 14 defining a circular cross section bore 16 each of which communicates with a respective one of the cavities 6. Towards its end remote from the face 8, each sleeve 14 is chamfered at 18 whereby its cross sectional area is reduced in the forward direction. About its rear end portion, the housing 4 is encircled by a collar 20 having cutouts 22 spaced evenly from one another about its periphery. Between the collar 20 and the face 8, the housing 4 is formed with laterally projecting latching members 24 each opposite to one of the cutouts 22, in the interest of straight action moulding of the housing 4, each member 24 having an inclined cam surface 26, best seen in FIG. 3, which slopes inwardly of the housing 4 in the forward direction thereof. Opposite to its surface 26, each latching member 24 has a latching shoulder 28 extending normally of the housing 4. There is force fitted into each the bore 16 and its communicating cavity 6 to project in the outward direction of the face 8, a test probe metal barrel 30 having at its rearward end, a tubular crimping ferrule 32, which is of reduced cross section with respect to the barrel 30. There is secured in each barrel 30, a test probe unit 34 comprising a metal tube 36 having a rearward closed end 38 and slidably receiving a test probe 40 having a conical, male contact head 42 and being urged outwardly of the tube 36 by a spring 44 acting between the closed end 38 thereof and the test probe 40. The crimping ferrule 32 of each barrel 30 is crimped to the electrically conductive core of an insulated electrical lead L1, as shown in FIG. 6, before the barrel 30 is assembled to the housing 4 and to the respective tube 36 which is secured in the barrel 30, for example by force fitting it into the barrel 30. Each tube 30 has, intermediate its ends, an external collar 45 by means of which it is force fitted into its cavity 6 and bore 16. Each test probe 40 is captivated in its tube 36 by means of a shoulder (not shown) on the probe 40 which engages a peened over edge 46 at the end of the tube 36 remote from its end 38, to limit the emergence of the probe 40 from the tube 36 under the action of the spring 44 therein.

Figure 5:
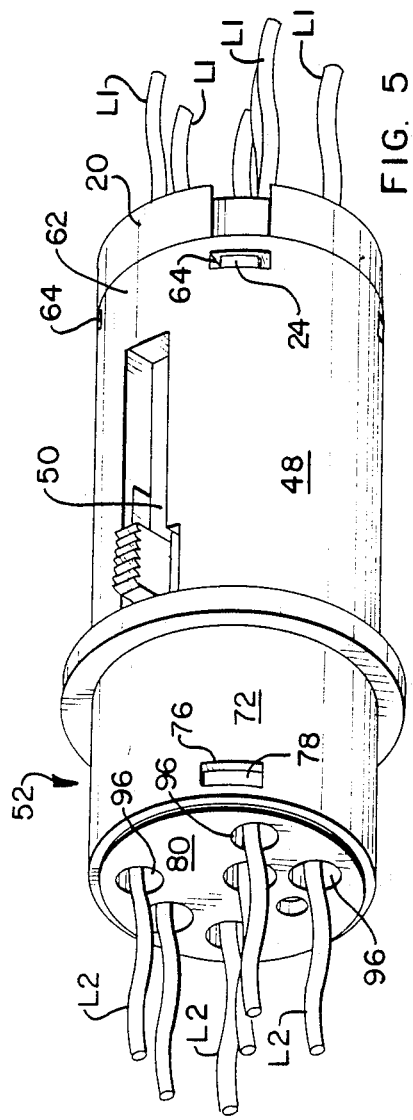
FIG. 5 is an isometric view of an electrical test probe assembly comprising the adaptor and being mated with a mating electrical socket connector.

A first version of the test probe assembly will now be described mainly with reference to FIGS. 5 to 7. Apart from the adaptor 2, the assembly comprises a standard electrical connector insulating pin housing 48 having latch arms 50 for latching it to the housing of a standard electrical socket connector 52. The housing 48 is formed with a plurality of through cavities 54 (one of which is shown in FIG. 6), each opening into a rearward, first mating face 56 and a forward, second mating face 58 of the housing 48. Each cavity 54 of the connector housing 48 is shaped for the reception therein of an electrical pin contact element 60 (FIG. 8). The housing 48 has a skirt 62 projecting rearwardly from its mating face 56, and being formed with latching windows 64 spaced from one another evenly, about its periphery and being of the same number and spacing as the latching members 24. When the housing 48 is in use as a pin connector housing, instead of being employed as part of the test probe assembly, the skirt 62 receives an anti-backout cap 66 (FIG. 8) having latching members 68 which latchingly engage in the windows 64 to secure the cap 66 in the skirt 62 to prevent the pin contact elements 60 from backing out from their cavities 54.

In order to provide the test probe assembly, the housing 4 of the adaptor 2 is inserted into the skirt 62 so that it is cammed resiliently outwardly to a small extent, by the cam surfaces 26 of the latching members 24 so each member 24 enters a respective one of the windows 64 the skirt 62 then resiles so that the shoulders 28 of the members 24 latch behind the rearward edges of the windows 64 these being of the same number and being the same circumferential positioning as the latch members 24. As the adaptor 2 is inserted into the skirt 62, at least one circular cross section key 70 projecting from the face 56 of the housing 48 engages in a respective one of the key ways 12 in the housing 4 and each sleeve 14 thereof enters a respective cavity 54 of the housing 48, as will be apparent from FIG. 6, the spring loaded test probes 40 projecting beyond the sleeves 14.

The mating connector 52, circuits associated with which are to be tested, by means of the test probe assembly 2, 48, the leads L1 of which have been connected to a diagnostic test instrument (not shown), comprises an insulating housing 72 having a rearwardly projecting skirt 74 which is identical with the skirt 62 described, above having latching windows 76 for receiving latching members 78 of an anti-backout cap 80 which is identical with the cap 66 described above. The housing 72 has a forward mating face 82 from the outer periphery of which projects a skirt 84 which is longitudinally divided to receive the latch arms 50 and within which is a series of hollow shafts 86 each communicating with a respective through cavity 88 in the housing 72, to define in co-operation therewith a continuous, electrical contact element receiving cavity 90. There is received in each cavity 90, an electrical socket contact element 92 having a crimping ferrule 94 crimped to an electrical lead L2 which extends through a respective opening 96 in the cap 80.

In order to test circuits (not shown) connected to the leads L2, the electrical test probe assembly 2, 48 is mated with the connector 52 so that the skirt 84 thereof is received in the housing 48 and the contact heads 42 of the test probes 40 each engage in the mouth of a respective one of the socket contact elements 92 as shown in FIG. 6. As the assembly 2, 48 is mated with the connector 52, the test probes 40 of the assembly 2, 48 are pushed resiliently back against the action of their springs 44 to the position shown in FIG. 6, until the housings 48 and 72 have been latched together by means of the latch arms 50. Thus each lead L1 is electrically connected to a respective lead L2 so as to enable the test operation to be carried out. When this has been done, the latch arms 50 are raised so that the assembly 2, 48 can be withdrawn from the connector 52.

A complete electrical testing kit for probing, not only connectors 52, but connectors 98 (FIG. 8) comprising housings 48 loaded with the contact elements 60, also comprises an adaptor 2' the housing 4 of which, is identical with the adaptor housing 4 described above, but has the test probe barrels 30 thereof loaded with test probe units 34', having female contact heads 32' which are concave to receive the tips of the pin contact elements 60. In this case, the adaptor 2' is mated with the housing 72, which has not been loaded either with the contact elements 92 or with the cap 80. When the adaptor 2' is mated with the housing 72, the heads 42 of the test probes 34' extend into the cavities 90 for engagement by the tips of the contact elements 60 of the connector 98 when the housing 72 of the electrical test probe assembly 2', 72 has been mated with the connector 98.

It will be apparent from the foregoing, that in order to provide the whole test kit, only standard connector housings need be provided, the only additional moulding needed, being the housing 4 and the only additional metal parts needed being two sets of the barrels 30, and one set each of the test probe units 34 and 34'.

I claim:

1. An electrical test probe assembly comprising;
an electrical test probe adaptor insulating housing formed with a plurality of through, first cavities each opening at one end outwardly of a mating face of the adaptor housing;
an electrically conductive test probe barrel secured in each through cavity, each said test probe barrel having fixed therein a tube containing a slidably mounted, but captive, electrical test probe projecting outwardly of said mating face and being urged axially away therefrom by a spring contained within said barrel, said barrel having means for electrically connecting it to an electrical lead to extend outwardly from the other end of the through cavity in which the barrel is secured;
an electrical connector insulating housing formed with a plurality of through second cavities each opening into first and second opposite mating faces of the connector housing which is matable with a mating electrical connector so that contact elements of the latter project towards, or into, respective ones of the second cavities; and
means for fixedly latching said adaptor and connector housings together with the mating face of the adaptor housing in aligned, face-to-face relationship with the first mating face of the connector housing, so that each test probe extends through, or into, a respective one of said second cavities for resilient engagement with a respective contact element of said mating electrical connector when it has been mated with said connector housing.

2. Assembly as claimed in claim 1 wherein the connector housing is formed with keying means for cooperation with complementary keying means of the adaptor housing.

3. An electrical testing kit comprising first and second electrical test probe assemblies in combination with first and second mating electrical connectors having female and male contact elements, respectively, the test probes of the first test probe assembly each having a convex contact head and the test probes of the second test probe assembly each having a concave contact head, the electrical connector insulating housing of the first test probe assembly being adapted to mate with the first mating electrical connector and the electrical connector housing of a second test probe assembly being adapted to mate with the second mating electrical connector, the first mating electrical connector having an insulating housing which is identical with the electrical connector housing of the second test probe assembly and the second mating connector having a housing which is identical with the electrical connector housing of the first test probe assembly.

4. A testing kit as claimed in claim 3 wherein the housing of each of the first and second mating electrical connectors has a contact element anti-backout cap which is lockable in a skirt projecting from the housing of that connector, the adaptor housing of each of the test probe assemblies being latchable into the skirt of the electrical connector housing thereof.

5. An electrical test probe adaptor comprising an insulating adaptor housing formed with a plurality of parallel, through cavities opening outwardly of a mating forward face of the adaptor housing and into an opposite rear face thereof; an electrically conductive test probe barrel secured in each through cavity and having therein a slidably mounted, but captive, electrical test probe projecting from one end of said barrel and outwardly of said mating face and being urged axially away therefrom by a spring, the other end of said barrel being crimped to an electrical lead extending from the rear face of the adaptor housing; a plurality of parallel, open ended, insulating sleeves extending from said mating face and each surrounding a respective one of said test probe barrels; and latching means projecting from the adaptor housing for latching it fixedly to a mating connector housing.

6. An adaptor as claimed in claim 5 wherein the housing is formed with at least one circular key way extending inwardly from the forward face thereof, for receiving a complimentary key on the mating connector housing.

7. An adaptor as claimed in claim 5, wherein said latching means are in the form of latching members distributed about the periphery of the adaptor housing between the forward and the rear faces thereof.

8. An adapter as claimed in claim 7, wherein the adaptor has a collar surrounding the rear face thereof, for engaging said mating connector housing the collar having cut outs each aligned with one of said latching members and extending to a greater extent about said periphery than said latching member.

9. An electrical test probe assembly comprising;
an electrical test probe adaptor insulating housing formed with a plurality of through, first cavities each opening at one end outwardly of a mating face of the adaptor housing;
an electrically conductive test probe barrel secured in each through cavity and having therein a slidably mounted, but captive, electrical test probe projecting outwardly of said mating face and being urged axially away therefrom by a spring, said barrel having means for electrically connecting it to an electrical lead to extend outwardly from the other end of the through cavity in which the barrel is secured;

an electrical connector insulating housing formed with a plurality of through second cavities each opening into first and second opposite mating faces of the connector housing which is matable with a mating electrical connector so that contact elements of the latter project towards, or into, respective ones of the second cavities, where each test probe barrel is surrounded by an open ended insulating sleeve projecting from the mating face of the adaptor insulating housing and being dimensioned for snug reception in a respective one of said second through cavities when the adaptor insulating housing is latched to the connector housing; and means for fixedly latching said adaptor and connector housings together with the mating face of the adaptor housing in aligned, face-to-face relationship with the first mating face of the connector housing, so that each test probe extends through, or into, a respective one of said second cavities for resilient engagement with a respective contact element of said mating electrical connector when it has been mated with said connector housing.

* * * * *